(12) United States Patent
Price

(10) Patent No.: US 7,012,190 B1
(45) Date of Patent: Mar. 14, 2006

(54) SEAM BRACKET FOR EMI SHIELDED STRUCTURE

(75) Inventor: John Thomas Price, Marion, VA (US)

(73) Assignee: General Dynamics Armament and Technical Products, Inc., Charlotte, NC (US)

(*) Notice: Subject to any disclaimer, the term of this patent is extended or adjusted under 35 U.S.C. 154(b) by 0 days.

(21) Appl. No.: 11/007,126

(22) Filed: Dec. 8, 2004

(51) Int. Cl.
    *H05K 9/00* (2006.01)
(52) U.S. Cl. ............................... 174/35 GC; 174/35 R
(58) Field of Classification Search .............. 174/35 R, 174/35 MS, 35 GC; 361/816, 818, 800
    See application file for complete search history.

(56) References Cited

U.S. PATENT DOCUMENTS

| | | | | |
|---|---|---|---|---|
| 3,217,085 A | * | 11/1965 | Lindgren | 174/35 MS |
| 3,340,587 A | * | 9/1967 | Beyer | 29/897.3 |
| 3,885,084 A | * | 5/1975 | Kaiserswerth et al. | 174/35 MS |
| 4,965,408 A | * | 10/1990 | Chapman et al. | 174/35 MS |
| 4,977,296 A | * | 12/1990 | Hemming | 174/35 MS |
| 5,164,543 A | * | 11/1992 | Benson et al. | 174/35 R |
| 5,367,123 A | * | 11/1994 | Plummer et al. | 174/36 |
| 5,532,428 A | | 7/1996 | Goulet et al. | |
| 5,595,801 A | * | 1/1997 | Fahy et al. | 428/40.1 |
| 5,656,795 A | * | 8/1997 | Miska | 174/35 GC |
| 5,737,193 A | | 4/1998 | LaRiviere et al. | |
| 5,786,547 A | | 7/1998 | Zielinski | |
| 5,796,033 A | * | 8/1998 | Stoyko | 174/35 C |
| 6,303,854 B1 | * | 10/2001 | Papaleo et al. | 174/35 R |
| 6,624,353 B1 | * | 9/2003 | Gabower | 174/35 R |
| 6,676,137 B1 | * | 1/2004 | Dean | 277/628 |

* cited by examiner

*Primary Examiner*—Hung V. Ngo
(74) *Attorney, Agent, or Firm*—Hunton & Williams

(57) ABSTRACT

The invention relates to a seam bracket for providing electrical contact between a first structural wall member and a second structural wall member. The seam bracket includes a flexible channel portion have a first wall and a second wall, the first wall having a first interior surface and a first exterior surface, the second wall having a second interior surface and a second exterior surface, a first plurality of barb members flexibly protruding outwardly from the first exterior surface, and a second plurality of barb members flexibly protruding outwardly from the second exterior surface. The seam bracket further includes a first side mount portion adjacent the first wall, the first side mount portion including a first plurality of fastener holes, and a second side mount portion adjacent the second wall, the second side mount portion including a second plurality of fastener holes.

21 Claims, 4 Drawing Sheets

SEAM BRACKET FOR EMI SHIELDED STRUCTURE

BACKGROUND OF THE INVENTION

The invention relates generally to a seam bracket for ensuring electrical contact between different structural components in an EMI shielded structure.

The operation of an electronic device may be interrupted or hindered by electromagnetic interference ("EMI"), which is radiated or conducted energy that adversely affects the performance of circuits in the electronic device. Many different types of electronic devices are susceptible to EMI and must be shielded to maintain proper performance. In military applications, this requires the use of EMI shielded shelters for housing important electronic equipment used to control military operations. This requirement transfers to the field where mobile command centers must also have the necessary EMI shielding to prevent disruption in the event of an electromagnetic pulse event.

One strategy for providing EMI shielding involves maintaining electrical contact between the several disparate structural components in a structure. If electrical contact can be maintained between the separate components, and the external surface of the three-dimensional structure is a single conductive surface, the interior of the structure will be shielded from outside EMI and radiation of EMI from the interior of the shelter. In physics, this is referred to as a "Faraday Cage." Although a perfect Faraday Cage cannot be obtained in nature, current designs have attempted to create structures with similar characteristics.

Especially in military applications, the current designs and methods for providing external EMI shielding have many drawbacks. The two main methods for providing EMI shielding along the edge-to-edge connections in structures include the use of "flame spraying," EMI caulk, or a combination of both. Flame spraying involves the generation of a high energy plasma arc that 'sprays' droplets of melted metals (molybdenum and tin) onto the adjoining surfaces to bridge the electrical conductivity of the surfaces. However, the process is expensive, time intensive, dangerous for workers, and environmentally unfriendly. The process of using EMI caulk involves the application of a paste, consisting of solvents, a rubberized base material, and an emulsion of silver particles. However, the drawback of EMI caulk is that small quantities of the material are very expensive. Moreover, both methods may be unreliable in the field when an EMI shielded structure may need to moved from location to location over rough terrain. The bonds created along the edge-to-edge connections are sometimes brittle, and may separate, requiring additional applications of flame spraying or EMI caulk.

Therefore, an object of the present invention is to provide a device for use in providing EMI shielded structures that is helpful in maintaining electrical contact and lowering electrical resistance between separate structural components in a structure, that is reliable, sturdy and inexpensive.

Accordingly, the invention provides an illustrative seam bracket, that overcome the disadvantages of known devices while offering features not present in known devices. Although certain deficiencies in the related art are described in this background discussion and elsewhere, it will be understood that these deficiencies were not necessarily heretofore recognized or known as deficiencies. Furthermore, it will be understood that, to the extent that one or more of the deficiencies described herein may be found in an embodiment of the claimed invention, the presence of such deficiencies does not detract from the novelty or non-obviousness of the invention or remove the embodiment from the scope of the claimed invention.

SUMMARY OF THE INVENTION

The invention, according to one embodiment, relates to a seam bracket for providing electrical contact between a first structural wall member and a second structural wall member. The seam bracket comprises a resilient channel portion having a first wall and a second wall, the first wall having a first interior surface and a first exterior surface, the second wall having a second interior surface and a second exterior surface. A first plurality of barb members flexibly protrudes outwardly from the first exterior surface, and a second plurality of barb members flexibly protrudes outwardly from the second exterior surface. The seam bracket further comprises a first side mount portion that is adjacent the first wall. The first side mount portion includes a first plurality of fastener holes. The second side mount portion is adjacent the second wall, and includes a second plurality of fastener holes.

The invention, according to another embodiment, relates to a structure employing a seam bracket. The structures comprises a first structural wall member having a first edge, a second structural wall member having a second edge, and a seam bracket. The seam bracket comprises a resilient channel portion have a first wall and a second wall, the first wall having a first interior surface and a first exterior surface, the second wall having a second interior surface and a second exterior surface, a first plurality of barb members flexibly protruding outwardly from the first exterior surface, and a second plurality of barb members flexibly protruding outwardly from the second exterior surface, the flexible channel portion disposed between the first edge and second edge, a first side mount portion adjacent the first wall, the first side mount portion including a first plurality of fastener holes, the first side mount portion affixed to the first structural wall member by a first plurality of fasteners disposed in the first plurality of fastener holes, and a second side mount portion adjacent the second wall, the second side mount portion including a second plurality of fastener holes, the second side mount portion affixed to the second structural wall member by a second plurality of fasteners disposed in the second plurality of fastener holes.

BRIEF DESCRIPTION OF THE DRAWINGS

The present invention can be more fully understood by reading the following detailed description of the presently preferred embodiments together with the accompanying drawings, in which like reference indicators are used to designate like elements, and in which.

DETAILED DESCRIPTION OF PREFERRED EMBODIMENTS

Figure 1:
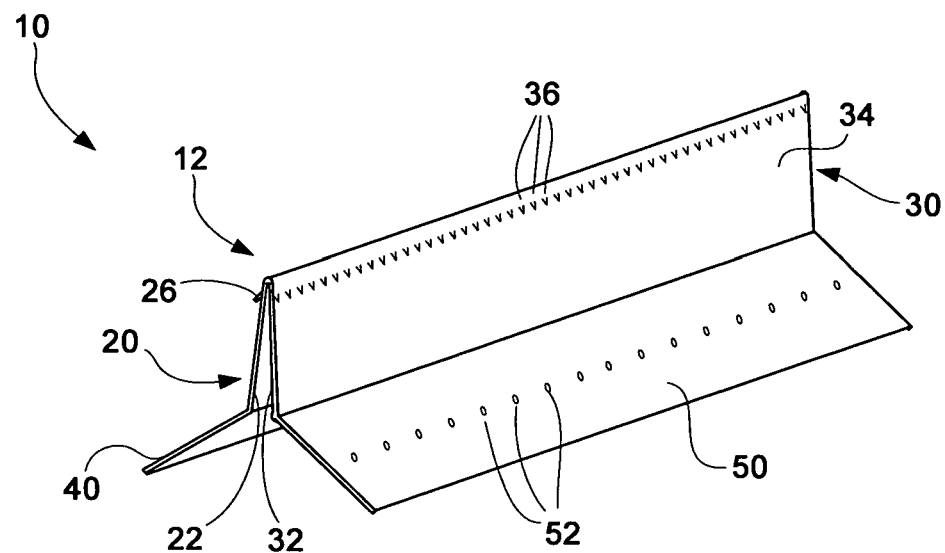
FIG. 1 is a perspective view of an illustrative seam bracket in accordance with one embodiment of the invention.
Figure 2:
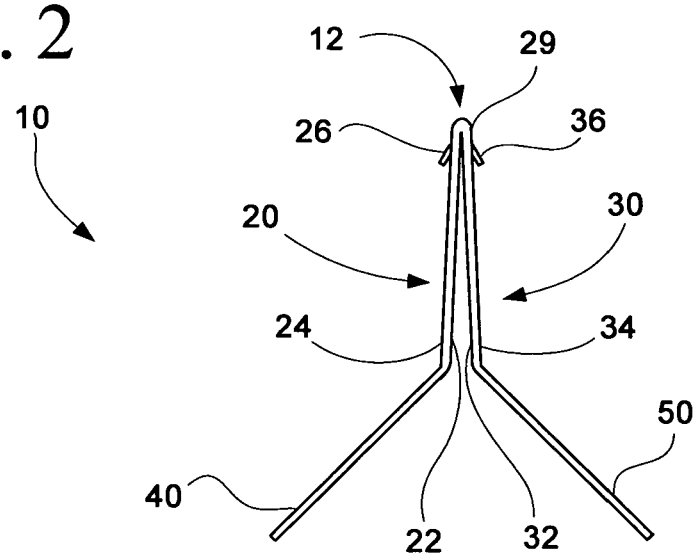
FIG. 2 is a frontal view of an illustrative seam bracket in accordance with one embodiment of the invention.
Figure 3:
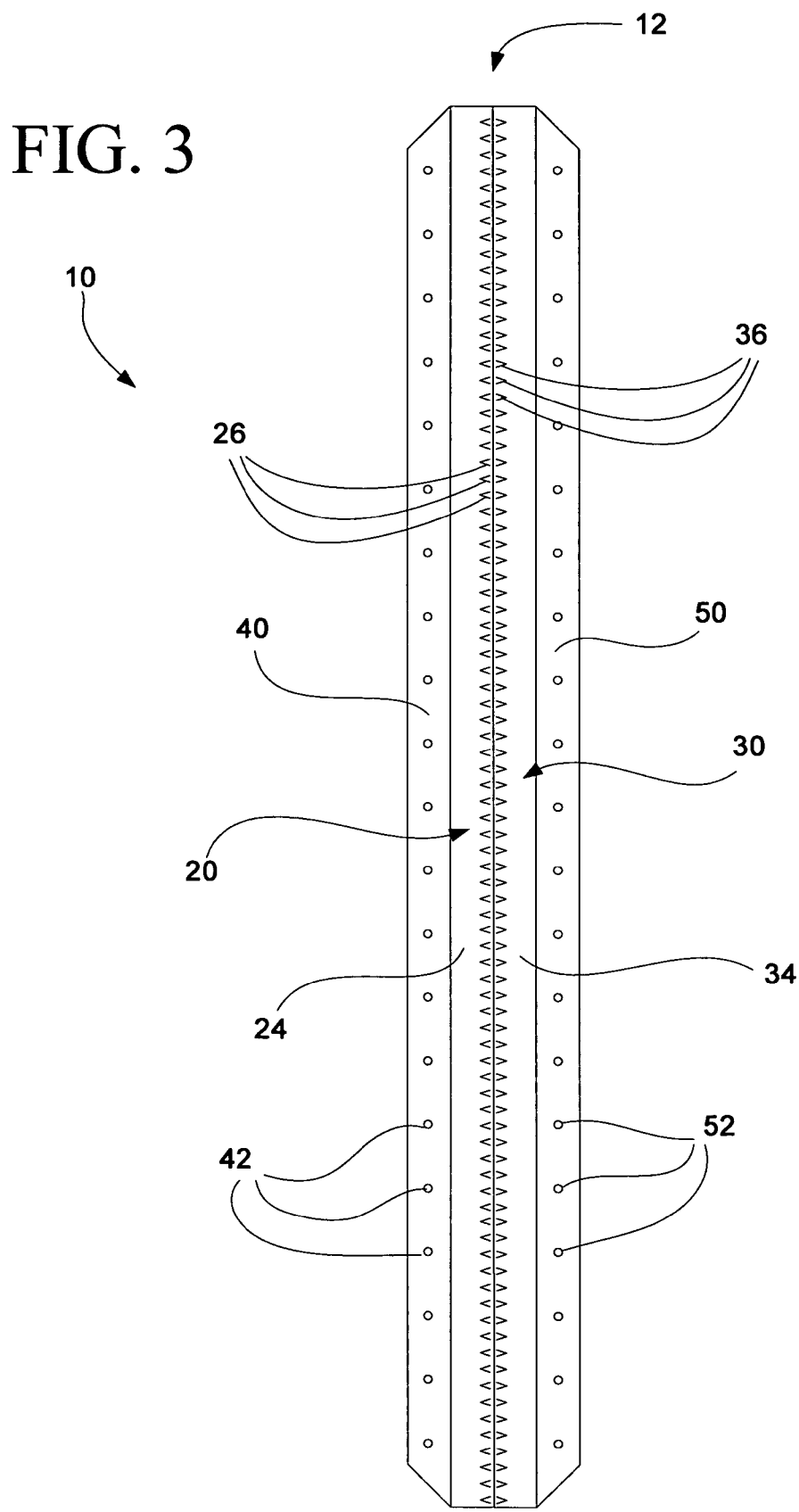
FIG. 3 is a top planar view of an illustrative seam bracket in accordance with one embodiment of the invention.

FIGS. 1–3 show a perspective view, frontal view and top planar view of an illustrative seam bracket in accordance with one embodiment of the invention. As shown in FIGS. 1–3, seam bracket 10 is a generally planar member comprised of a resilient channel portion 12, a first side mount portion 40, and a second side mount portion 50. The resilient channel portion 12 is configured for placement in a seam gap formed between the edges of a pair of adjoining, structural wall members. When the channel portion 12 is inserted in such a seam gap, the first side mount portion 40 and the second side mount portion 50 allow for the seam bracket 10 to be affixed to both of the two adjoining, structural wall members. The seam bracket 10 offers the unique advantage that once the channel portion 12 is inserted between the edges of the wall members, and the two side mount portions 40, 50 are affixed to the two wall members, a plurality of projections (barbs 26, 36, described in more detail below) protrude outwardly from the channel portion 12 to contact both wall members in the seam gap. This, in turn, ensures electrical contact between the two wall members, and overall, lowers the joint electrical resistance of the two wall members. When used to bridge seam gaps throughout a three-dimensional structure, seam bracket 10 contributes to significantly enhance a structure's EMI shielding capabilities.

As shown in FIGS. 1–3, channel portion 12 is generally comprised of a first wall 20 and a second wall 30 joined at a fold region 29. Importantly, the channel portion 12 is flexible and resilient to allow for its insertion into a seam gap, and eventual contact with the edges of the adjoining wall members. For example, channel portion 12 may be compressed by bringing the first interior surface 26 of first wall 20 closer to the second interior surface 36 of second wall 30. When the compression force is released, the first wall 20 and second wall 30 expand outwardly, in a spring-like fashion, in an effort to return to the resting configuration of channel portion 12. The spring-like expansion further allows the plurality of barbs 26, 36 protruding outwardly from the channel portion 12 to contact the edges of the structural wall members. As shown in FIGS. 1–3, first wall 20 includes a first plurality of barbs 26 projecting outwardly from its first exterior surface 24, and the second wall 30 includes a second plurality of barbs 36 projecting outwardly from the second exterior surface 34. It should be appreciated that barbs 26, 36 are resilient and flexible, and if compressed within the seam gap, will attempt to return in a spring-like fashion to their resting configuration, as best shown in FIG. 2. Barbs 26, 36 are also triangular shaped, with the base portion attached to exterior surfaces 24, 34, and the point facing outwardly to allow for penetration into any surface coating, material or corrosion on the contact edge of the two structural wall members.

To provide for these resilient characteristics in the channel portion and barbs, the seam bracket is constructed of suitable material having the necessary properties to allow for its resiliency in the seam gap, while also having the structural integrity to hold the wall members together. In one preferred embodiment, seam bracket 10 may be formed of a single, unitary piece of conductive material, such as steel, stainless steel, aluminum, or copper/bronze alloys, for example.

As stated above, the first and second side mount portions 40, 50, are used to affix the seam bracket 10 to the pair of structural side members being joined. The first side mount portion 40 is located adjacent to the first wall 20, while the second side mount portion 50 is located adjacent to the second wall 30. Both the first side mount portion 40 and second side mount portion 50 include a plurality of fastener holes, 42, 52, respectively, for receiving a plurality of fasteners for attaching the seam bracket 10 to the structural wall members. Although represented as rectangular shaped portions in FIGS. 1–3, side mount portions 40, 50 may be configured in any shape or size that allows for fastening to the structural wall members. Moreover, it should be appreciated that FIG. 3 shows the seam bracket 10 in a flattened configuration for illustrative purposes only, as opposed to FIGS. 1–2, which show seam bracket 10 in its preset form as configured for insertion into a seam gap and use in joining two structural wall members.

Figure 4:
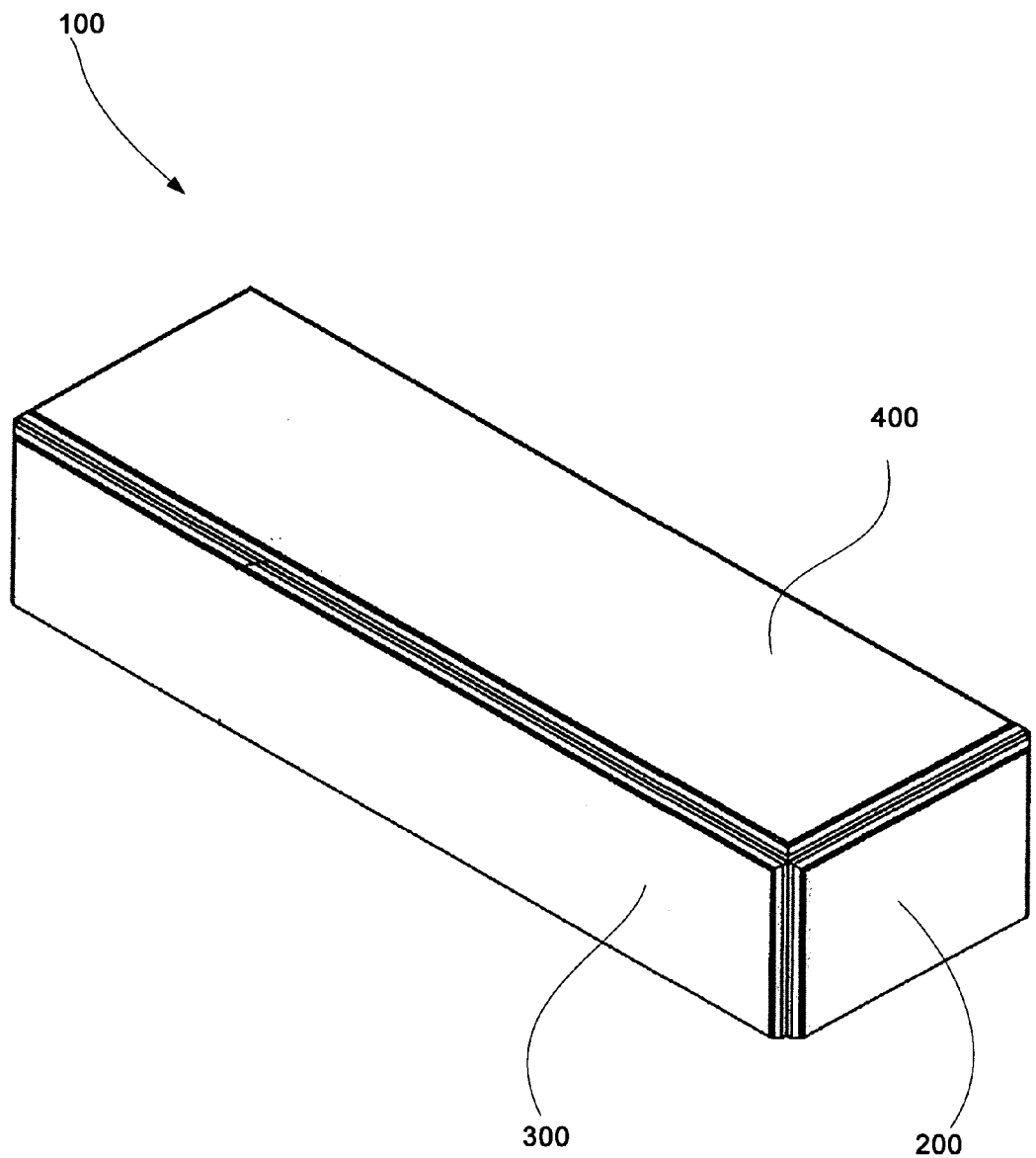
FIG. 4 is an isometric view of an illustrative three-dimensional structure in accordance with one embodiment of the invention.

As described above, When used to bridge seam gaps throughout a three-dimensional structure, seam bracket 10 contributes to significantly enhance a structure's EMI shielding capabilities. FIG. 4 is a perspective view of an illustrative three-dimensional structure employing a plurality of seam brackets to provide enhanced EMI shielding in accordance with another embodiment of the invention. As shown in FIG. 4, structure 100 is a rectangular shaped structure including at least first, second and third structural wall members 200, 300, 400, respectively. Although not illustrated in this perspective view of structure 100, structure 100 is preferably comprised of at least five or six structural wall members employing a plurality of seam brackets to provide enhanced EMI shielding to the interior of the structure 100. Accordingly, FIG. 5 is a top planar view of the seam between the first structural wall member and second structural wall member of FIG. 4 in further detail.

Figure 5:
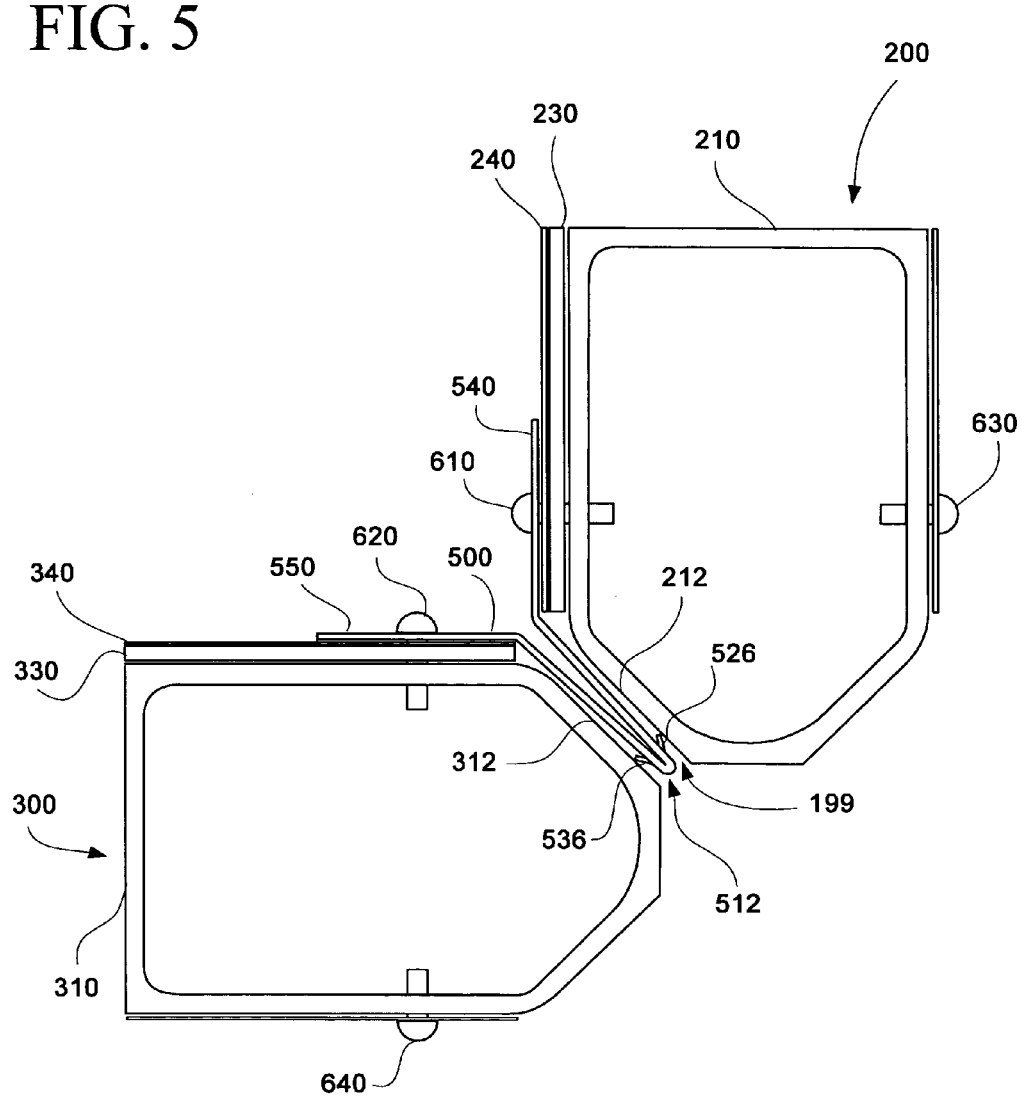
FIG. 5 is a planar view of an illustrative structural junction in accordance with one embodiment of the invention.

As shown in FIG. 5, first structural wall member 200 is defined by its wall frame 210 that includes at least one chamfered edge 212 for arranging with the second structural wall member 300. Likewise, the second structural wall member 300 is defined by its wall frame 310 that includes chamfered edge 312. When arranging the two structural wall members 200, 300 for assembly of the structure 100, the chamfered edges 212, 312, are arranged to form the seam gap 199 wherein the seam bracket 500 will be inserted.

In FIG. 5, seam bracket 500 is inserted into seam gap 199 between the two structural wall members 200, 300. It should be appreciated that seam bracket 500 shares the same features of seam bracket 10, described in detail above. Within seam gap 199, the resilient channel portion 512 flexes outwardly forcing barbs 526, 536 into contact with the first and second chamfered edges 212, 312. This contact ensures electrical contact between the two adjoining, structural wall members 200, 300.

On the exterior of structure 100, exterior wall sheets, 220, 320 are affixed to the exterior faces of the two structural wall members 200, 300 using outer fasteners 630, 640, respectively. On the interior of structure 100, thermal barriers 230, 330, and interior wall sheets 240, 340, are affixed to the inner faces of the two structural wall members 200, 300. Thermal barriers 230, 330 are adapted to reduce heat loss through the structure. In at least one embodiment, thermal barriers 230, 330 may be constructed of fiberglass, and the interior and exterior wall sheets, 220, 240, 320, 340, may be constructed of aluminum. It should further be appreciated that other materials with insulating properties may be used for the thermal barriers, other than fiberglass, including thermoplastic resins, thermoset resins, or wood, for example.

Also shown in FIG. 5, a first fastener 610 is inserted through the first side mount portion 540 of seam bracket 500 to secure the first side mount portion 540 to the frame 210 of first structural wall member 200. At the same time, the first fastener 610 is inserted through interior wall sheet 240 and thermal barrier 230, securing each of the inner components together. Similarly, a second fastener 620 is inserted through the second side mount portion 550 of seam bracket 500, through interior wall sheet 340 and thermal barrier 330, to secure the second side mount portion 550 to the frame 310 of second structural wall member 300.

When the entire structure 100 is constructed as described above, the structure 100 provides an improved EMI shielded structure that is highly resistant to destructive EMI. It should be appreciated that the aforementioned structure employing the seam bracket of the invention to provide electrical contact between adjoining structural wall members may be constructed in various shapes, sizes and configurations. Such a structure may further be used as a shelter, or for a mobile command center, for example.

As described above, fasteners are used to secure the seam bracket in place, and affixed or coupled to the adjoining, structural wall members. To enhance the EMI shielding capabilities of the structure, and provide an additional source of ensuring electrical contact between the components being secured together, such fasteners are preferably constructed of conductive material. The types of fasteners may include bolts, studs, screws, nuts, washers, rivets, pins and custom formed parts, or combinations of the above, that are used to couple the seam sealer to other structural components. In one embodiment, unique rivets that enhance EMI shielding characteristics may also be used, such as those described in commonly owned U.S. patent application Ser. No. 11/007,127 entitled "EMI Proofing Rivet," filed Dec. 8, 2004, the contents of which are incorporated by reference in their entirety.

The seam bracket of this invention may be suitable for many applications, including, for example, aerospace, aircrafts, industrial equipment, computers, electric shielding structures for radar, cell phone installations, tempest certified products, communications, for example.

While the foregoing description includes details and specificities, it is to be understood that these have been included for purposes of explanation only, and are not to be interpreted as limitations of the present invention. Modifications to the embodiments described above can be made without departing from the spirit and scope of the invention, which is intended to be encompassed by the following claims and their legal equivalents.

What is claimed is:

1. A seam bracket comprising:
a resilient channel portion having a first wall and a second wall, the first wall having a first interior surface and a first exterior surface, the second wall having a second interior surface and a second exterior surface, a first plurality of barb members flexibly protruding outwardly from the first exterior surface, and a second plurality of barb members flexibly protruding outwardly from the second exterior surface;
a first side mount portion adjacent the first wall, the first side mount portion including a first plurality of fastener holes; and
a second side mount portion adjacent the second wall, the second side mount portion including a second plurality of fastener holes.

2. The seam bracket of claim 1, wherein the resilient channel portion is adapted for insertion into a seam gap between a first structural wall member and a second structural wall member.

3. The seam bracket of claim 2, wherein the resilient channel portion is adapted for providing electrical contact between the first structural wall member and the second structural wall member.

4. The seam bracket of claim 1, wherein the first plurality of barb members and second plurality of barb members are resilient.

5. The seam bracket of claim 1, wherein the first plurality of barb members are adapted to contact a first edge of the a structural wall member, and the second plurality of barb members are adapted to contact a second edge of a second structural wall member.

6. The seam bracket of claim 1, wherein the first plurality of barb members are adapted to penetrate surface material on a first edge of the a structural wall member.

7. The seam bracket of claim 6, wherein the conductive material comprises stainless steel.

8. The seam bracket of claim 6, wherein the conductive material comprises aluminum.

9. The seam bracket of claim 6, wherein the conductive material comprises a copper-bronze alloy.

10. The seam bracket of claim 1, wherein the first plurality of barb members are triangular shaped and have a point adapted to penetrate surface material on a first edge of the a structural wall member.

11. The seam bracket of claim 1, wherein the seam bracket is comprised of a unitary piece of conductive material.

12. A structure comprising:
a first structural wall member having a first edge;
a second structural wall member having a second edge;
a seam bracket comprising:
a resilient channel portion having a first wall and a second wall, the first wall having a first interior surface and a first exterior surface, the second wall having a second interior surface and a second exterior surface, a first plurality of barb members flexibly protruding outwardly from the first exterior surface, and a second plurality of barb members flexibly protruding outwardly from the second exterior surface, the flexible channel portion disposed between the first edge and second edge;
a first side mount portion adjacent the first wall, the first side mount portion including a first plurality of fastener holes, the first side mount portion affixed to the first structural wall member by a first plurality of fasteners disposed in the first plurality of fastener holes;
a second side mount portion adjacent the second wall, the second side mount portion including a second plurality of fastener holes, the second side mount portion affixed to the second structural wall member by a second plurality of fasteners disposed in the second plurality of fastener holes.

13. The structure of claim 12, wherein the resilient channel portion is adapted for providing electrical contact between the first structural wall member and the second structural wall member.

14. The structure of claim 12, wherein the first plurality of barb members and second plurality of barb members are resilient.

15. The structure of claim 12, wherein the first plurality of barb members are adapted to contact the first edge of the first structural wall member, and the second plurality of barb members are adapted to contact the second edge of the second structural wall member.

16. The structure of claim 12, wherein the first plurality of barb members are adapted to penetrate surface material on the first edge of the first structural wall member.

17. The structure of claim 12, wherein the first plurality of barb members are triangular shaped and have a point adapted to penetrate surface material on the first edge of the first structural wall member.

18. The structure of claim 12, wherein the seam bracket is comprised of a unitary piece of conductive material.

19. The structure of claim 18, wherein the conductive material comprises stainless steel.

20. The structure of claim 18, wherein the conductive material comprises aluminum.

21. The structure of claim 18, wherein the conductive material comprises a copper-bronze alloy.

* * * * *